(12) United States Patent
Ichijyo

(10) Patent No.: US 12,025,640 B2
(45) Date of Patent: Jul. 2, 2024

(54) CURRENT DETECTION DEVICE

(71) Applicant: DENSO CORPORATION, Kariya (JP)

(72) Inventor: Hiromi Ichijyo, Kariya (JP)

(73) Assignee: DENSO CORPORATION, Kariya (JP)

( * ) Notice: Subject to any disclaimer, the term of this patent is extended or adjusted under 35 U.S.C. 154(b) by 118 days.

(21) Appl. No.: 17/941,705

(22) Filed: Sep. 9, 2022

(65) Prior Publication Data

US 2023/0003769 A1    Jan. 5, 2023

Related U.S. Application Data

(63) Continuation of application No. PCT/JP2021/007127, filed on Feb. 25, 2021.

(30) Foreign Application Priority Data

Mar. 31, 2020 (JP) ................................. 2020-062632

(51) Int. Cl.
*G01R 15/20* (2006.01)
*G01R 19/00* (2006.01)
(Continued)

(52) U.S. Cl.
CPC ........... *G01R 15/207* (2013.01); *G01R 15/20* (2013.01); *G01R 19/0092* (2013.01);
(Continued)

(58) Field of Classification Search
CPC .............. G01R 15/207; G01R 19/0092; G01R 19/16547; G01R 15/20; H02M 1/0009;
(Continued)

(56) References Cited

U.S. PATENT DOCUMENTS

2008/0285845 A1* 11/2008 Kang .................. H04N 25/683
382/162
2016/0126882 A1* 5/2016 Nakao .................. H02M 7/003
318/490
(Continued)

FOREIGN PATENT DOCUMENTS

JP    2016-039734 A    3/2016
JP    2021-164241 A    10/2021
(Continued)

OTHER PUBLICATIONS

U.S. Appl. No. 17/954,693, filed Sep. 28, 2022 in the name of Yamahira et al.
(Continued)

*Primary Examiner* — Raul J Rios Russo
(74) *Attorney, Agent, or Firm* — Oliff PLC

(57) ABSTRACT

A current detection device includes: a first conductor providing a part of a current path between a first inverter and a first rotary electric machine; a second conductor providing a part of a current path between a second inverter and a second rotary electric machine; a third conductor providing a part of a current path between a DC power supply and a converter; and first to third elements respectively arranged to face the first to third conductors. Each of the first to third elements is configured to detect a magnetic flux generated by an electric current flowing through a corresponding conductor in a coreless manner. A maximum value of the electric current in the second conductor is smaller than maximum values of the electric current in the first and third conductors. The second conductor is arranged between the first conductor and the third conductor in a predetermined direction.

4 Claims, 5 Drawing Sheets

(51) Int. Cl.
  *G06F 18/22*  (2023.01)
  *G06N 3/088* (2023.01)
  *H02M 1/00* (2007.01)
  *H02M 7/5387* (2007.01)
  *H02P 5/74* (2006.01)

(52) U.S. Cl.
  CPC ....... *H02M 1/0009* (2021.05); *H02M 7/5387* (2013.01); *H02P 5/74* (2013.01); *G06F 18/22* (2023.01); *G06N 3/088* (2013.01)

(58) Field of Classification Search
  CPC ...... H02M 7/5387; H02M 1/008; H02M 1/44; H02M 1/327; H02M 3/158; H02M 7/003; H02M 3/003; H02P 5/74; G06F 18/22; G06N 3/088
  USPC ........................................................ 324/126
  See application file for complete search history.

(56) References Cited

U.S. PATENT DOCUMENTS

2020/0025803 A1   1/2020  Esaka et al.
2022/0199317 A1*  6/2022  Kawamura ......... H02M 1/0009

FOREIGN PATENT DOCUMENTS

| JP | 2021-164242 A | 10/2021 |
|----|---------------|---------|
| WO | 2021/199803 A1 | 10/2021 |
| WO | 2021/199804 A1 | 10/2021 |

OTHER PUBLICATIONS

U.S. Appl. No. 17/954,593, filed Sep. 28, 2022 in the name of Hashimoto et al.

\* cited by examiner

CURRENT DETECTION DEVICE

CROSS REFERENCE TO RELATED APPLICATIONS

The present application is a continuation application of International Patent Application No. PCT/JP2021/007127 filed on Feb. 25, 2021, which designated the U.S. and claims the benefit of priority from Japanese Patent Application No. 2020-062632 filed on Mar. 31, 2020. The entire disclosures of all of the above applications are incorporated herein by reference.

TECHNICAL FIELD

The present disclosure relates to a current detection device.

BACKGROUND

For example, a power conversion device includes a voltage converter, a first inverter, and a second inverter. The voltage converter boosts the voltage of a direct current power output from a battery and supplies the boosted direct current power to each inverter. The first inverter converts the supplied direct current into an alternating current and outputs the alternating current to a first motor. The second inverter converts the supplied direct current into an alternating current and outputs the alternating current to a second motor. A current detection device may be used in such a power conversion device.

SUMMARY

The present disclosure describes a current detection device used for a power conversion device.

BRIEF DESCRIPTION OF DRAWINGS

Objects, features, and advantages disclosed in this specification will become apparent by referring to the following detailed descriptions and accompanying drawings, in which.

DETAILED DESCRIPTION

Figure 1:
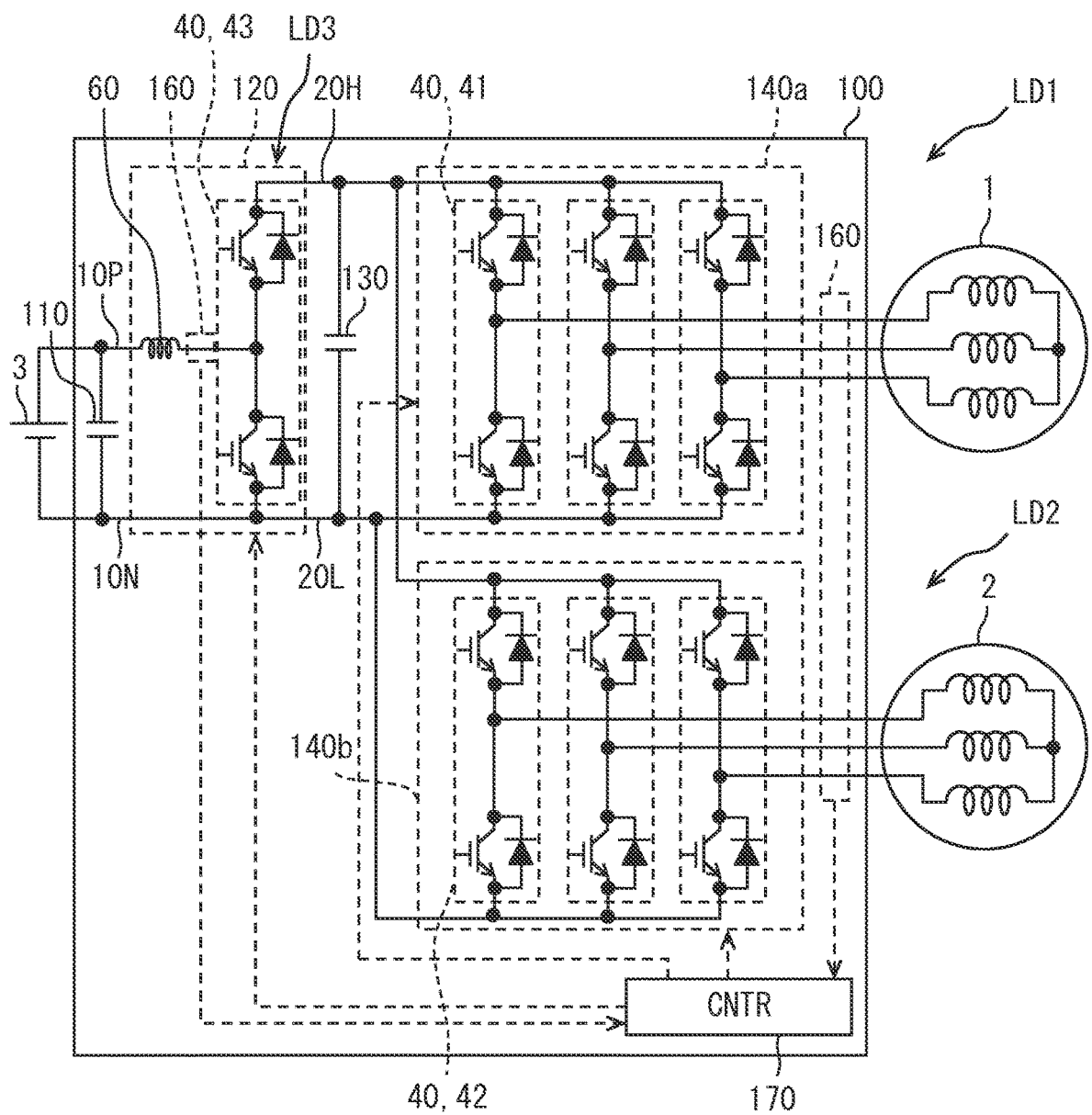
FIG. 1 is a circuit diagram of a power conversion device to which a current detection device according to a first embodiment is applied.

To begin with, a relevant technology will be described only for understanding the embodiments of the present disclosure.

For example, in a power conversion device including a voltage converter, a first inverter, and a second inverter, the voltage converter boosts the voltage of a direct current power output from a battery and supplies the boosted direct current power to each inverter. The first inverter converts the supplied direct current into an alternating current and outputs the alternating current to a first motor. The second inverter converts the supplied direct current into an alternating current and outputs the alternating current to a second motor.

A current detection device used in such a power conversion device includes a terminal unit containing first to third current sensors therein. The first current sensor measures an output current of the first inverter, and the second current sensor measures an output current of the second inverter. The third current sensor measures an electric current flowing through a reactor of the voltage converter.

In general, a current sensor has a magnetizing core and a magnetic detection element. The magnetizing core has a shape surrounding a bus bar through which an electric current to be measured flows, and forms a path of a magnetic flux generated by the electric current flowing through the bus bar. The magnetic detection element is arranged in a gap (space) provided in the magnetizing core, and detects the magnitude of the magnetic flux passing through the gap to thereby detect the magnitude of the current flowing through the bus bar.

On the other hand, in recent years, the development of a coreless current sensor abolishing the magnetizing core has been promoted. If the coreless current sensor can be realized, the size of a current detection device equipped with a plurality of current sensors can be significantly reduced. However, if the size of the current detection device is reduced as a result of the coreless structure without having the magnetizing core, the distance between the plurality of bus bars becomes smaller. As a result, new problems such as an increase in thermal interference and an increase in magnetic interference between adjacent bus bars will arise.

The present disclosure provides a current detection device that can realize the reduction in size by adopting a coreless current sensor while suppressing increases in thermal interference and magnetic interference.

According to an aspect of the present disclosure, a current detection device is for a power conversion device including a converter that boosts voltage of an electric power supplied from a DC power supply, a first inverter that converts a direct current boosted by the converter into an alternating current and outputs the alternating current to a first rotary electric machine, and a second inverter that converts a direct current boosted by the converter into an alternating current and outputs the alternating current to a second rotary electric machine. The current detection device includes: a first conductor configured to form a part of a current path between the first inverter and the first rotary electric machine; a second conductor configured to form a part of a current path between the second inverter and the second rotary electric machine; a third conductor configured to form a part of a current path between the DC power supply and the converter; a first element arranged to face the first conductor and configured to detect a magnetic flux generated by an electric current flowing through the first conductor in a coreless manner; a second element arranged to face the second conductor and configured to detect a magnetic flux generated by an electric current flowing through the second conductor in a coreless manner; a third element arranged to face the third conductor and configured to detect a magnetic flux generated by an electric current flowing through the third conductor in a coreless manner. A maximum value of the electric current flowing through the second conductor is smaller than a maximum value of the electric current flowing through the first conductor, and is smaller than a maximum value of the electric current flowing through the third conductor. The second conductor is arranged side by side with the first conductor and the third conductor in a predetermined direction, and is arranged between the first conductor and the third conductor.

The maximum values of the electric currents flowing through the first to third bus bars are different. In a case where the first to third bus bars are arranged side by side in a predetermined direction, if the bus bars having larger maximum current values are arranged next to each other, mutual thermal interference and magnetic interference are likely to increase. In view of this point, in the current detection device described above, the bus bar (second bus bar) having the maximum current value smallest among the first to third bus bars is arranged between the other bus bars (first and third bus bars). Therefore, a distance between the first bus bar and the third bus bar can be increased, and the thermal interference and magnetic interference between the bus bars having larger maximum current values can be suppressed.

As described above, the size reduction of the current detection device can be achieved by adopting the coreless current sensor, and the increases in thermal interference and magnetic interference due to the size reduction can be suppressed.

Disclosed aspects in this specification may adopt different technical solutions from each other in order to achieve their respective objectives.

Embodiments will be described with reference to the drawings. In some embodiments, parts that are functionally and/or structurally corresponding to each other and/or associated with each other are given the same reference numerals, or reference numerals with different hundred digit or more digits. For corresponding parts and/or associated parts, reference can be made to the description of other embodiments.

First Embodiment

In FIG. 1, a power conversion device 100 is mounted on an electric vehicle. The power conversion device 100 controls an electric power supplied to a rotary electric machine in the electric vehicle and an electric power regenerated from the rotary electric machine. The electric vehicle includes a hybrid electric vehicle powered by an internal combustion engine and a rotary electric machine, and a battery electric vehicle powered only by a rotary electric machine. The power conversion device 100 provides power conversion between a plurality of devices including a first rotary electric machine 1, a second rotary electric machine 2, and a DC power supply 3. The power conversion device 100 includes a current detection device.

The first rotary electric machine 1 and the second rotary electric machine 2 are three-phase AC type rotary electric machines. The first rotary electric machine 1 is mainly used as a traveling drive source of a vehicle, for example. The second rotary electric machine 2 is used, for example, as a generator that generates electricity mainly by utilizing a rotary driving force output from an internal combustion engine of a vehicle. The DC power supply 3 is a power supply unit that outputs a DC voltage, and includes a rechargeable secondary battery such as a lithium ion battery. The DC power supply 3 may be a fuel cell, for example.

The power conversion device 100 includes a capacitor 110 as a filter, a converter 120, a smoothing capacitor 130, a first inverter 140a, a second inverter 140b, a sensor unit 160, and a control circuit 170 (CNTR).

The capacitor 110 is provided between a positive electrode line 10P and a negative electrode line 10N. The positive electrode line 10P is a power line connected to a positive electrode of the DC power supply 3, and is provided by an electric wire and/or a bus bar. The negative electrode line 10N is a power line connected to a negative electrode of the DC power supply 3, and is provided by an electric wire and/or a bus bar. The capacitor 110 functions as a filter for removing noise of the DC voltage supplied from the DC power supply 3 to the converter 120.

The converter 120 is a voltage conversion circuit. The converter 120 is a circuit that converts a ratio of a potential difference between the positive electrode line 10P and the negative electrode line 10N to a potential difference between a high potential line 20H and a low potential line 20L. The high potential line 20H and the low potential line 20L are lines for allowing high power flowing through the first rotary electric machine 1 and the second rotary electric machine 2. The converter 120 is a conversion circuit that converts a DC voltage into a DC voltage having a different voltage value. The converter 120 is used for converting the DC voltage between the DC power supply 3 and the first inverter 140a and between the DC power supply 3 and the second inverter 140b. The converter 120 functions as a step-up circuit for stepping up the DC voltage supplied from the DC power supply 3. The converter 120 may function as a step-down circuit for stepping down the voltage between the high potential line 20H and the low potential line 20L.

The converter 120 includes a semiconductor switching element and a reactor 60. The semiconductor switching element is provided by a reverse conduction insulated gate bipolar transistor as shown. The semiconductor switching element can be provided by various elements such as a power MOSFET or a SiC transistor.

The converter 120 includes two semiconductor switching elements connected in series between the high potential line 20H and the low potential line 20L. The plural semiconductor switching elements are provided by a module 40 in which the plural semiconductor switching elements are housed in one package.

The converter 120 has one module 40 and one reactor 60. However, if it is desired to increase the boosting capacity of the converter 120, the converter 120 may have a plurality of modules 40 and a plurality of reactors 60. The reactor 60 is arranged in series between a connection point between the semiconductor switching element on a high side and the semiconductor switching element on a low side and the positive electrode line 10P.

The smoothing capacitor 130 is provided between the high potential line 20H and the low potential line 20L. The smoothing capacitor 130 has a function of smoothing the voltage between the high potential line 20H and the low potential line 20L.

The first inverter 140a is arranged between the high and low potential lines 20H and 20L and the first rotary electric machine 1. The first inverter 140a provides DC-to-AC conversion between DC power and three-phase AC power. The first inverter 140a converts the electric power flowing to the first rotary electric machine 1.

The second inverter 140b is arranged between the high and low potential lines 20H and 20L and the second rotary electric machine 2. The second inverter 140b provides DC-to-AC conversion between DC power and three-phase AC power. The second inverter 140b converts the electric power flowing to the second rotary electric machine 2.

The first inverter 140a and the second inverter 140b each include a plurality of semiconductor switching elements. The plurality of semiconductor switching elements provide two sets of three-phase bridge circuits. In each of the first inverter 140a and the second inverter 140b, the semiconductor switching element on the high side and the semiconductor switching element on the low side are provided by the module 40. The first inverter 140a and the second inverter 140b each include a plurality of modules 40. Of the plurality of modules 40, the module included in the first inverter 140a corresponds to a first module 41, and the module included in the second inverter 140b corresponds to a second module 42. Of the plurality of modules 40, the module included in the converter 120 corresponds to a third module 43.

The first inverter 140a has three first modules 41. The second inverter 140b has three second modules 42. In the illustrated example, the power conversion device 100 has seven modules 40.

In the illustrated example, one module 40 has two semiconductor switching elements. Instead, one module 40 can include any number of semiconductor switching elements. One module 40 may contain, for example, one set of three-phase bridge circuits. Further, one module 40 may accommodate a plurality of semiconductor switching elements on the high side and a plurality of semiconductor switching elements on the low side. The number of semiconductor switching elements accommodated in one module 40 and the circuit configuration thereof can be changed in various ways.

The sensor unit 160 provides a "current detection device" that detects a current flowing through each part of the power conversion device 100. The sensor unit 160 includes a plurality of detection units 161, 162, and 163.

Of the plurality of detection units, first detection units 161 detect a first current I1 between the first inverter 140a and the first rotary electric machine 1. Second detection unit 162 detect a second current I2 between the second inverter 140b and the second rotary electric machine 2. A third detection unit 163 detects a third current I3 flowing through the converter 120. The sensor unit 160 includes a coreless current sensor arranged in the vicinity of a conductor as a target to be detected. The sensor unit 160 includes a plurality of bus bars 61b, 62b, 63b as a plurality of conductors. The sensor unit 160 includes a plurality of coreless current sensors. The coreless current sensor detects the magnetic flux generated by an electric current to be detected without having a large magnetizing core for collecting the magnetic flux generated by the electric current to be detected.

The control circuit 170 exerts a function of controlling the operation of the plurality of semiconductor switching elements included in the converter 120, the first inverter 140a, and the second inverter 140b. The control circuit 170 includes, for example, a memory that stores software for control and a microcomputer that includes a processor for executing the software.

The control circuit 170 controls power conversion by controlling the operation of the semiconductor switching elements based on the electric currents detected by the sensor unit 160 and the like. The control circuit 170 is configured to respond to a command from a higher-level control device installed inside or outside the vehicle, for example. The control circuit 170 sets, for example, a target fluctuation pattern of the electric current flowing to each phase of the first rotary electric machine 1 and/or the second rotary electric machine 2 based on the output torque request signal from the higher-level control device. The control circuit 170 monitors the current flowing through the first rotary electric machine 1, the second rotary electric machine 2, and the converter 120 by the sensor unit 160. The control circuit 170 feedback-controls the first inverter 140a and/or the second inverter 140b so as to realize the target fluctuation pattern.

The power conversion device 100 converts, for example, the DC voltage supplied from the DC power supply 3 into a three-phase alternating current and supplies the alternating current to the first rotary electric machine 1. The power conversion device 100 drives the vehicle through the first rotary electric machine 1 by using the electric power charged in the DC power supply 3. This operation mode is called an EV drive mode. For example, the power conversion device 100 converts the three-phase alternating current supplied from the second rotating electric machine 2, which generates electricity by the rotational driving force of the internal combustion engine, into three-phase alternating current having a different frequency and the like, and supplies the converted alternating current to the first rotary electric machine 1. The power conversion device 100 drives the vehicle through the first rotary electric machine 1 by using the electric power that is generated by using the rotational driving force of the internal combustion engine. This operation mode is called an in-line HV drive mode. In addition, the power conversion device 100 may provide, for example, a regenerative drive mode in which the first rotary electric machine 1 and/or the second rotary electric machine 2 functions as a generator and charges the DC power supply 3.

The circuit including the first rotary electric machine 1 and the first inverter 140a provides a first switch circuit LD1 through which a controllable first current I1 flows. The first switch circuit LD1 includes an electric wire and/or a bus bar that provides an energization path. In other words, the first switch circuit LD1 controls the first current I1. The circuit including the second rotary electric machine 2 and the second inverter 140b provides a second switch circuit LD2 through which a controllable second current I2 flows. The second switch circuit LD2 includes an electric wire and/or a bus bar that provides an energization path. In other words, the second switch circuit LD2 controls the second current I2. The converter 120 provides a third switch circuit LD3 through which a controllable third current I3 flows. The third switch circuit LD3 includes an electric wire and/or a bus bar that provides an energization path. In other words, the third switch circuit LD3 controls the third current I3. The switch circuits LD1, LD2, and LD3 are also called load circuits.

The electric currents flowing through the switch circuits LD1, LD2, and LD3 have current relationships satisfying at least the following third and fourth conditions. Preferably, the current relationships satisfy all of the first to fourth conditions.

First condition: $I1 > I2$ Ex. (1)

Second condition: $I1 > I3$ Ex. (2)

Third condition: $I2\ max < I1\ max$ Ex. (3)

Fourth condition: $I2\ max < I3\ max$ Ex. (4)

I1 max is a first maximum current representing the maximum value of the first current I1 assumed. I2 max is a second maximum current representing the maximum value of the second current I2 assumed. I3 max is a third maximum current representing the maximum value of the third current I3 assumed.

The current relationship represented by the above expressions (1) to (4) can be realized by setting the roles of the first rotary electric machine 1, the second rotary electric machine 2, and the converter 120. For example, the above current relationships can be realized by using the first rotary electric machine 1 as the main power source for traveling. The above current relationships can also be realized by a configuration of the power transmission system arranged between the first rotary electric machine 1 and the second rotary electric machine 2 and the drive wheels of the vehicle. The configuration of the power transmission system may be provided by various configurations such as planetary gears. The current relationships represented by the above expressions (1) to (4) may be realized by the control of the control circuit 170. The power conversion device 100 provides a plurality of different operating modes by controlling, for example, the converter 120, the first inverter 140a, and the second inverter 140b.

The current relationships described above may be provided in the EV drive mode. For example, the expressions (3) and (4) may be satisfied by the maximum value of the second current I2 in the EV drive mode, the maximum value of the third current I3 in the EV drive mode, and the maximum value of the first current I1 in the EV drive mode.

The current relationships described above may be provided in the in-line HV drive mode. For example, the expressions (3) and (4) may be satisfied by the maximum value of the second current I2 in the in-line HV drive mode, the maximum value of the third current I3 in the in-line HV drive mode, and the first current I1 in the in-line HV drive mode.

The current relationships described above may be provided in both the EV drive mode and the in-line HV drive mode. For example, the expressions (3) and (4) may be satisfied by the maximum value of the second current I2 in both modes, the maximum value of the third current I3 in both modes, and the maximum value of the first current I1 in both modes.

Further, the current relationships represented by the above expressions (1) to (4) also appears in the currents flowing between the plurality of switch circuits LD1, LD2, LD3 (switch unit 140 described later) and the smoothing capacitor 130. The current flowing between the second switch circuit LD2 and the smoothing capacitor 130 is smaller than the current flowing between the first switch circuit LD1 and the smoothing capacitor 130. The current flowing between the second switch circuit LD2 and the smoothing capacitor 130 is smaller than the current flowing between the third switch circuit LD3 and the smoothing capacitor 130. According to the illustrated configuration, in the second switch circuit LD2, the amount of heat generated due to Joule heat is the smallest. Further, due to the magnitude of the second current I2, the surge voltage caused by the inductance component is the smallest in the second switch circuit LD2.

Figure 2:
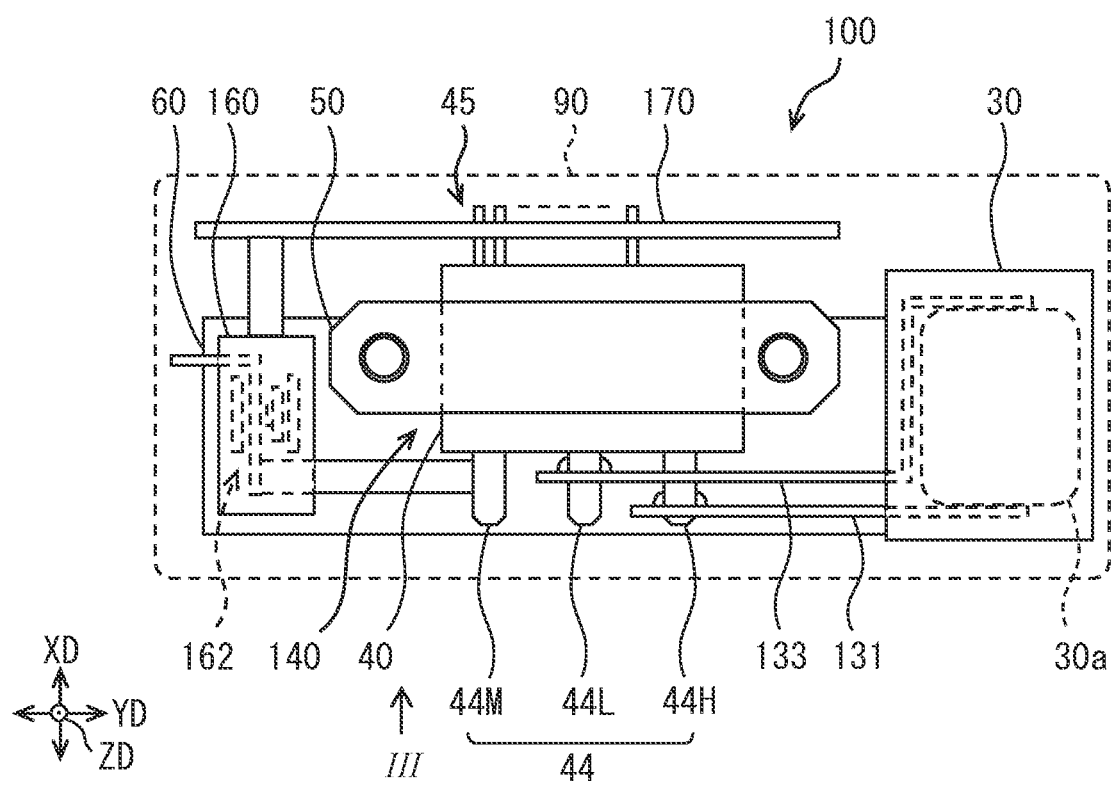
FIG. 2 is a side view of the power conversion device.
Figure 3:
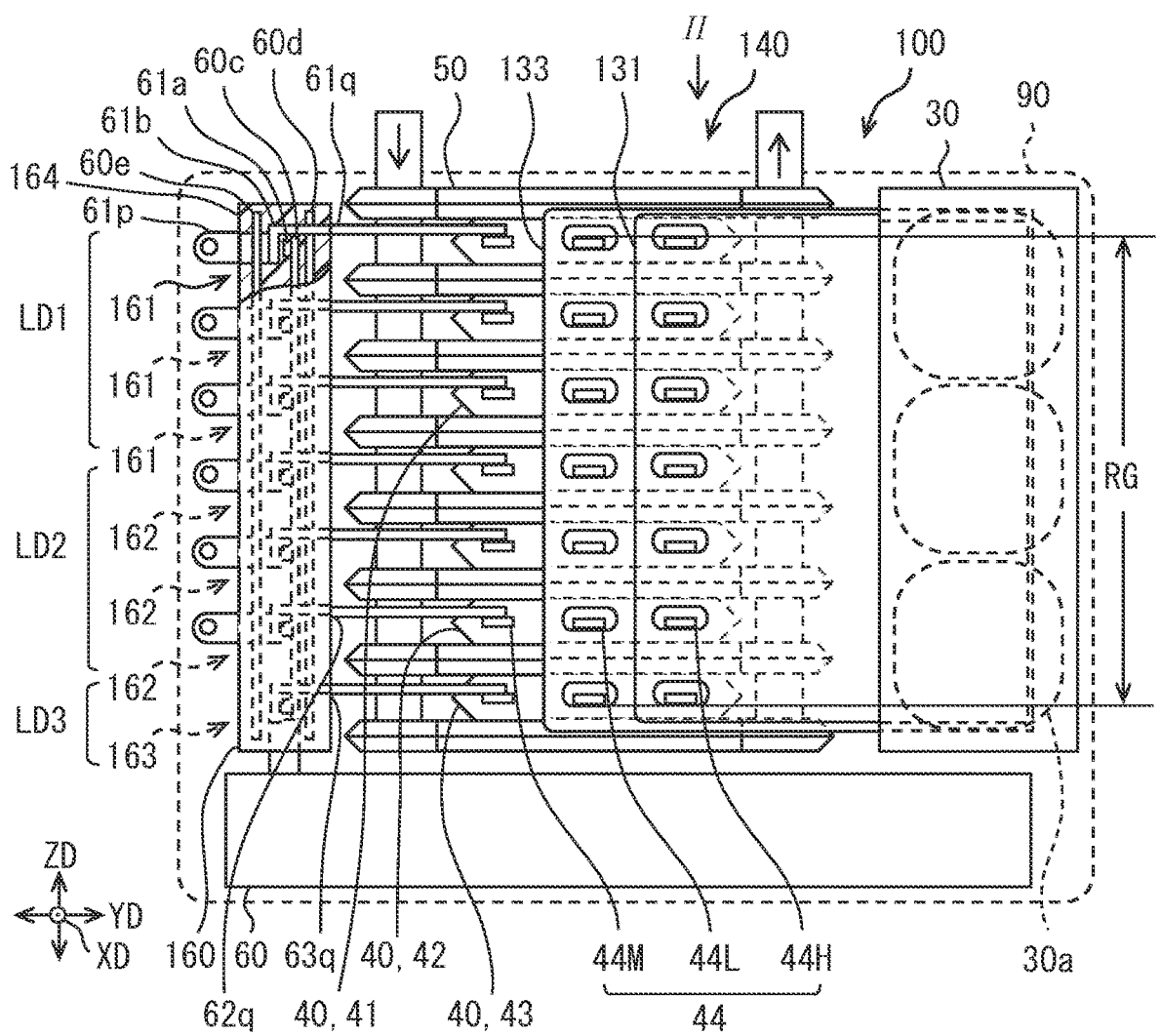
FIG. 3 is a plan view of the power conversion device.

In FIGS. 2 and 3, the arrangement of a plurality of parts in the power conversion device 100 is illustrated. FIG. 2 is a side view of the power conversion device 100 when viewed in a direction along an arrow II in FIG. 3. FIG. 3 is a plan view of the power conversion device 100 when viewed in a direction along an arrow III in FIG. 2. In FIGS. 2 and 3, for convenience, a Cartesian coordinate system including a height direction XD, a width direction YD, and a depth direction ZD is shown. The names of height, width, and depth are used for convenience only and do not limit the installation direction of the power conversion device 100. The power conversion device 100 can be oriented in various directions with respect to the direction of gravity. The power conversion device 100 includes a case 90. The case 90 houses the plurality of parts of the power conversion device 100.

The power conversion device 100 includes the plurality of modules 40. Each module 40 is a flat plate-shaped semiconductor module. Each module 40 includes three power terminals 44 including a high potential terminal 44H, a low potential terminal 44L, and a connection point terminal 44M. The high potential terminal 44H is connected to the high potential line 20H. The low potential terminal 44L is connected to the low potential line 20L. The connection point terminal 44M is a connection point between the high side semiconductor switching element and the low side semiconductor switching element. The connection point terminal 44M is connected to the first rotary electric machine 1, the second rotary electric machine 2, or the reactor 60. Each module 40 includes a plurality of control terminals 45 for a control signal and a monitor signal. The plurality of control terminals 45 are connected to the control circuit 170. The plurality of power terminals 44 and the plurality of control terminals 45 extend from edges of the module 40 along the height direction XD.

The plurality of modules 40 are arranged in a stacked manner in the depth direction ZD. The plurality of modules 40 are arranged so that their plate-shaped principal planes are parallel to each other and overlap each other. The plurality of modules 40 are arranged so that their edges are aligned in the depth direction ZD. The plurality of modules 40 provide a plurality of power terminals 44 including at least the high potential terminals 44H and the low potential terminals 44L. The plurality of power terminals 44 are arranged so as to form a plurality of rows. The three power terminals 44 project in the height direction XD from a side surface of the module 40, the sides surface facing in the height direction XD. The power terminals 44 of the same kind projecting from different modules 40 are aligned to form a row in the depth direction ZD. In other words, the plurality of modules 40 are arranged along the depth direction ZD so that the plurality of power terminals 44 form a plurality of rows. In the following description, the depth direction ZD is also referred to as an arrangement direction. Further, a range in which the plurality of power terminals 44 are positioned in the arrangement direction is also referred to as an arrangement range RG.

The power conversion device 100 includes a cooler 50 for cooling the plurality of modules 40. The cooler 50 has a flow path through which a cooling medium such as water flows. The plurality of modules 40 and the cooler 50 provide a liquid-cooled switch unit 140. Therefore, the switch unit 140 includes the plurality of modules 40 that accommodate the semiconductor switching elements and have the power terminals 44. The switch unit 140 includes the cooler 50 that cools the plurality of modules 40.

In the switch unit 140, the plurality of power terminals 44 are arranged in three rows in the arrangement direction. The plurality of power terminals 44 may be arranged in any numbers of rows such as one row, two rows, three rows, or four rows.

In other words, in the switch unit 140, the plurality of power terminals 44 of the first switch circuit LD1, the second switch circuit LD2, and the third switch circuit LD3 are arranged in a predetermined order over the arrangement range RG. The plurality of power terminals 44 are arranged so that the power terminals 44 of the first switch circuit LD1 and the power terminals 44 of the third switch circuit LD3 are located on both sides of the power terminals 44 of the second switch circuit LD2. In other words, the predetermined order is the order of the first switch circuit LD1, the second switch circuit LD2, and the third switch circuit LD3.

The second modules 42 through which the second current I2 flows are located between the first modules 41 in which the first current I1 larger than the second current I2 flows and the third module 43 through which the third current I3 larger than the second current I2 flows. The second modules 42 are positioned in an intermediate region of the switch unit 140, and the first modules 41 and the third module 43 are positioned in opposite end regions, respectively.

The reactor 60 is arranged next to the switch unit 140 in the depth direction ZD. The reactor 60 is arranged over the capacitor unit 30, the switch unit 140, and the sensor unit 160. The control circuit 170 is arranged above the switch unit 140 in the height direction XD. A circuit board of the control circuit 170 is connected to the plurality of control terminals 45 above the switch unit 140. The arrangement of the capacitor unit 30, the reactor 60, the sensor unit 160, and the control circuit 170 with respect to the switch unit 140 is not limited to the arrangement shown in the drawing.

The high potential line 20H is provided by a bus bar 131. The bus bar 131 is electrically connected to the plurality of high potential terminals 44H. The low potential line 20L is provided by a bus bar 133. The bus bar 133 is electrically connected to the plurality of low potential terminals 44L.

The bus bars 131 and 133 also function as bus bars for connecting capacitor elements 30a housed in the capacitor unit 30. The bus bars 131 and 133 are also called condenser bus bars.

The capacitor unit 30 has the plurality of capacitor elements 30a connected in parallel. In FIG. 3, three capacitor elements 30a are illustrated. The capacitor unit 30 may have one, two, four or more capacitor elements 30a. Further, the capacitor unit 30 may accommodate a capacitor 110 in addition to the smoothing capacitor 130.

The bus bar 131 is electrically connected to the plurality of power terminals 44. The bus bar 133 is electrically connected to the plurality of power terminals 44. Each of the bus bars 131 and 133 has a large width over the arrangement range RG in the depth direction ZD, and electrically connects the plurality of power terminals 44 and the capacitor elements 30a over the width.

The sensor unit 160 has a plurality of detection units 161, 162, and 163. The detection units 161, 162, and 163 each detect the current flowing through the connection point terminal 44M and outputs the detection signal to the control circuit 170. The sensor unit 160 is connected to the control circuit 170. In the sensor unit 160, the respective detection units 161, 162, 163 include elements shown as partial fracture views in FIG. 3. The sensor unit 160 accommodates the of detection units 161, 162, and 163 in a body 164 made of an insulating resin. The sensor unit 160 also serves as a terminal block.

The sensor unit 160 has a pair of magnetic shield plates 60d and 60e extending over the plurality of detection units 161, 162, and 163. The shield plates 60d and 60e provide shielding effects against external magnetic flux coming from the outside of the sensor unit 160. The sensor unit 160 has a circuit board 60c as a support member that extends over the plurality of detection units 161, 162, and 163.

The detection units 161, 162, and 163 have bus bars 61b, 62b, and 63b, respectively. The bus bars 61b, 62b, and 63b have terminals 61p for external connection and terminals 61q for connection with the connection point terminals 44M, respectively. The bus bars 61b, 62b, and 63b each have a crank-shape with at least one bend.

The bus bars 61b, 62b, and 63b are arranged at the same position in the height direction XD, and are arranged side by side in the depth direction ZD (predetermined direction). Similarly, the terminals 61p and 61q are arranged at the same position in the height direction XD, and are arranged side by side in the depth direction ZD. As the connection point terminals 44M are arranged at equal pitches in the depth direction ZD, the terminals 61q, 62q, and 63q are also arranged at equal pitches in the depth direction ZD.

The detection units 161, 162, and 163, respectively, have elements 61a, 62a, and 63a that are coreless current sensors and mounted on the circuit board 60c. Of the plurality of elements, the first element 61a detects the first current I1, the second element 62a detects the second current I2, and the third element 63a detects the third current I3. The elements 61a, 62a, and 63a are arranged close to and facing the respective bus bars 61b, 62b, and 63b. The elements 61a, 62a, and 63a detect magnetic flux caused by the currents flowing through the bus bars 61b, 62b, and 63b, respectively, and output signals indicating the current values.

More specifically, each of the plurality of bus bars 61b, 62b and 63b generates the magnetic flux due to the current flowing therethrough. The current flowing through one of the plurality of bus bars 61b, 62b, and 63b produces a normal magnetic flux to be detected. The normal magnetic flux interlinks with the corresponding element 61a, 62a, 63a associated with the one of the bus bars 61b, 62b, 63b. The element 61a, 62a, 63a generates and outputs an electric signal corresponding to the normal magnetic flux. This electric signal is used as a signal indicating the current value flowing through the bus bar 61b, 62b, 63b.

Figure 4:
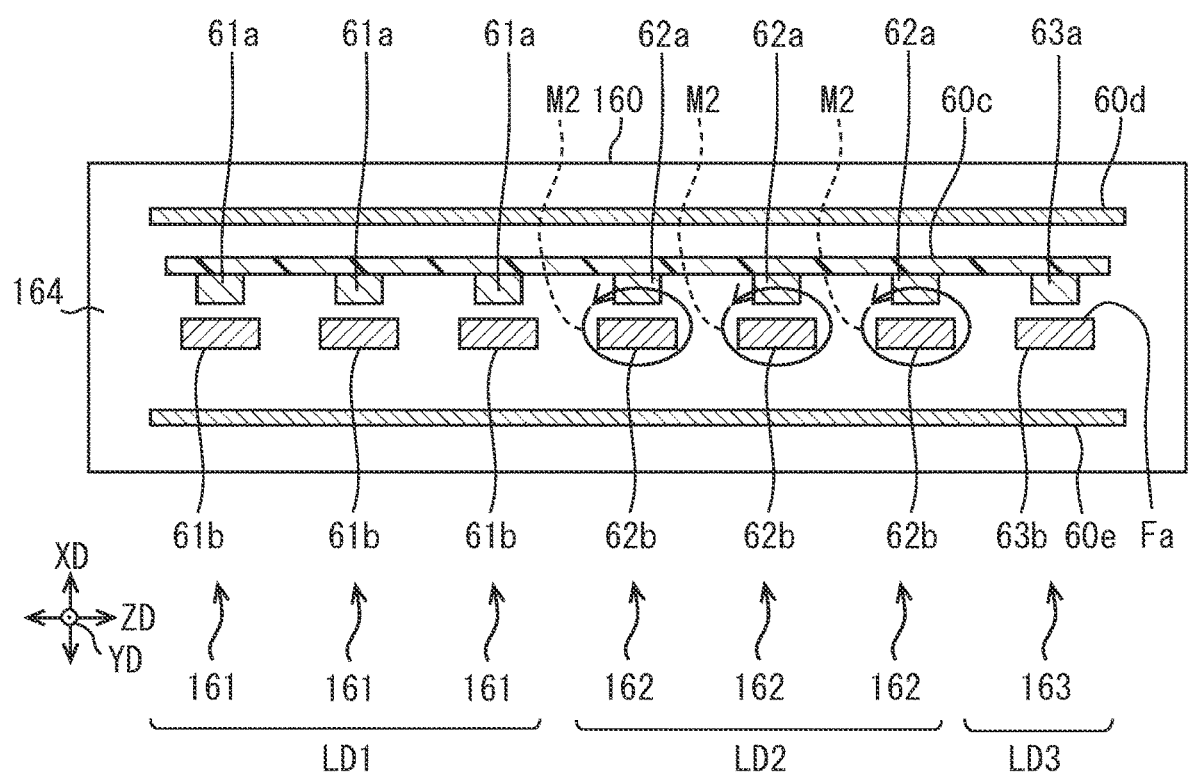
FIG. 4 is a cross-sectional view for showing interference between a plurality of elements.

FIG. 4 illustrates a case where the current is flowing through the second switch circuit LD2 as the current to be detected. In the case of FIG. 4, each of the second bus bars 62b belonging to the second detection units 162 generates a normal magnetic flux M2. Each of the second elements 62a belonging to the first detection units 161 outputs an electric signal caused by the magnetic flux M2.

The elements 61a, 62a, and 63a are arranged at the same position in the height direction XD, and are arranged side by side in the depth direction ZD. The direction in which the elements 61a, 62a and 63a are arranged (depth direction ZD) is parallel to the direction in which the modules 41, 42, and 43 are arranged. The elements 61a, 62a, and 63a are arranged at the same position in the width direction YD. That is, as shown in FIG. 3, the elements 61a, 62a, and 63a are arranged side by side on a straight line extending in the depth direction ZD.

A part of each of the bus bars 61b, 62b, and 63b facing the elements 61a, 62a, and 63a has a rectangular shape in a cross-section defined perpendicular to the width direction YD. In other words, the bus bars 61b, 62b, and 63b each have the rectangular shape in cross-section perpendicular to the direction in which the current flows. The plurality of bus bars 61b, 62b, and 63b are arranged so that the longitudinal direction of the rectangular shape is parallel to the predetermined direction (depth direction ZD) along which the bus bars 61b, 62b, 63b are arranged (see FIG. 4). In other words, the elements 61a, 62a, and 63a are arranged so as to face the longitudinal surface Fa of the rectangular shape of the bus bars 61b, 62b, and 63b.

Of the plurality of detection units, the first detection unit 161 detects the first current I1 flowing through the first switch circuit LD1. The first bus bar 61b, which is a bus bar of the first detection unit 161, belongs to the first switch circuit LD1. The first bus bar 61b corresponds to a first conductor forming a part of a current path between the first inverter 140a and the first rotary electric machine 1. The sensor unit 160 includes three first detection units 161 for detecting three-phase power. The three first detection units 161 are arranged next to each other so as to form a group of detection units 161. The group of the first detection units 161 are arranged next to the connection point terminals 44M belonging to the first switch circuit LD1.

Of the plurality of detection units, the second detection unit 162 detects the second current I2 flowing through the second switch circuit LD2. The second bus bar 62b, which is a bus bar of the second detection unit 162, belongs to the second switch circuit LD2. The second bus bar 62b corresponds to a second conductor forming a part of the current path between the second inverter 140b and the second rotary electric machine 2. The sensor unit 160 includes three second detection units 162 for detecting three-phase power. The three second detection units 162 are arranged next to each other so as to form a group of detection units 162. The group of the second detection units 162 are arranged next to the connection point terminals 44M belonging to the second switch circuit LD2.

Of the plurality of detection units, the third detection unit 163 detects the third current I3 flowing through the third switch circuit LD3. The third bus bar 63b, which is a bus bar of the third detection unit 163, belongs to the third switch circuit LD3. The third bus bar 63b corresponds to a third conductor forming a part of the current path between the DC power supply 3 and the converter 120. The sensor unit 160 includes one third detection unit 163 for detecting single-phase power in the converter 120. The third detection unit 163 is arranged next to the connection point terminal 44M belonging to the third switch circuit LD3. In a case where the converter 120 has a plurality of detection targets, the sensor unit 160 may include a plurality of third detection units 163. In such a case, the plurality of third detection units 163 are arranged next to each other so as to form a group of detection units 163.

The group of the second detection units 162 is arranged between the group of the first detection units 161 and the group of the third detection unit 163 with respect to the arrangement direction. The sensor unit 160 extends over the arrangement range RG of the power terminals 44, along the arrangement direction of the power terminals 44. In the illustrated example, the sensor unit 160 extends over all connection point terminals 44M, along the depth direction ZD.

In FIG. 4, the single sensor unit 160 including the plurality of detection units is illustrated as an outer shape for ease of understanding. Hatching showing a resin material (i.e., the body 164) that forms the sensor unit 160 is not shown.

In the sensor unit 160, the pair of shield plates 60d and 60e are arranged to face each other and so as to interpose the elements 61a, 62a, and 63a and the bus bars 61b, 62b, and 63b therebetween. In the example shown in FIGS. 3 and 4, the pair of shield plates 60d and 60e are arranged side by side in the width direction YD.

Of the pair of shield plates 60d and 60e, portions interposing the first element 61a and the first bus bar 61b therebetween correspond to a first magnetic shield. Portions of the shield plates 60d and 60e interposing the second element 62a and the second bus bar 62b therebetween corresponds to a second magnetic shield. Portions of the shield plates 60d and 60e interposing the third element 63a and the third bus bar 63b therebetween corresponds to a third magnetic shield. In the example of FIG. 4, the first magnetic shield, the second magnetic shield, and the third magnetic shield are integrally formed and connected. However, these magnetic shields may be formed separately and separated from each other.

Hereinafter, the effects of the sensor unit 160 as the current detection device having the above-described configuration will be described.

In the present embodiment, since the coreless current sensor without having a magnetizing core is adopted, the size of the sensor unit 160 can be significantly reduced as compared with the current sensor having the magnetizing core. Nevertheless, it is possible to suppress the increase in thermal interference and magnetic interference caused by the size reduction, as will be described below.

The electric current flowing through the first bus bar 61b, the second bus bar 62b, and the third bus bar 63b have different maximum values. That is, the first maximum current I1 max, the second maximum current I2 max, and the third maximum current I3 max are different. In the case where these bus bars 61b, 62b, and 63b are arranged side by side in the predetermined direction (depth direction ZD), if the bus bars having a larger maximum current are arranged next to each other, thermal interference and magnetic interference therebetween are likely to increase.

For example, if the first bus bar 61b and the third bus bar 63b are arranged next to each other contrary to the present embodiment, the temperature of the third bus bar 63b rises due to the heat generated by the first bus bar 61b, or the temperature of the third bus bar 63b is rises due to the heat generated by the third bus bar 63b. That is, the thermal interference is likely to be large. Further, the magnetic field generated by the current flowing through the first bus bar 61b interferes with the current flowing through the third bus bar 63b, or the magnetic field generated by the current flowing through the third bus bar 63b interferes with the current flowing through the first bus bar 61b. That is, the magnetic interference is likely to increase.

In view of these circumstances, in the present embodiment, the bus bar in which the maximum value of the electric current is the smallest among the bus bars 61b, 62b, and 63b is arranged between the other bus bars. That is, in the present embodiment, the second maximum current I2 max is smaller than the first maximum current I1 max and the third maximum current I3 max, so that the second bus bar 62b is arranged between the first bus bar 61b and the third bus bar 63b. Therefore, the distance between the first bus bar 61b and the third bus bar 63b can be increased, and thermal interference and magnetic interference between the bus bars having the larger maximum current values can be suppressed.

According to the present embodiment, as described above, the sensor unit 160 can be significantly reduced in size by adopting the coreless current sensor, and yet the increase in thermal interference and magnetic interference due to the size reduction can be suppressed.

Here, the first magnetic shield, the second magnetic shield, and the third magnetic shield, respectively, receive radiant heat from the bus bars 61b, 62b, and 63b, and dissipate the heat to the outside air. Therefore, the atmospheric temperature of the bus bars 61b, 62b, and 63b can be reduced as the area of the shield increases, resulting to the contribution to the temperature reduction of the bus bars 61b, 62b, and 63b.

In view of this point, in the present embodiment, the first magnetic shield, the second magnetic shield, and the third magnetic shield are integrally formed and connected as shield plates 60d and 60e. Therefore, the area of the shield can be increased, which can contribute to the temperature reduction of the bass bars 61b, 62b, and 63b. In particular, it is assumed that the amount of heat generated by the first bus bar 61b is larger than that of the other bus bars. By integrally forming the shield as described above, the heat generated from the first bus bar 61b is conducted from the first magnetic shield to the second magnetic shield and the third magnetic shield. Therefore, it is possible to promote the reduction in the atmospheric temperature of the first bus bar 61*b*.

Further, in the present embodiment, the first element 61*a*, the second element 62*a*, and the third element 63*a* are arranged side by side on a straight line. Therefore, the body size of the sensor unit 160 in the width direction YD can be reduced, as compared with the case where the elements 61*a*, 62*a*, and 63*a* are alternately arranged in the width direction YD. Specifically, the shield plates 60*d* and 60*e* can be reduced in size in the width direction YD, and the body 164 can be reduced in size in the width direction YD.

In the present embodiment, the bus bars 61*b*, 62*b* and 63*b* arranged in the predetermined direction (depth direction ZD) have a rectangular shape in cross-section defined perpendicular to the direction in which the current flows. Further, the bus bars 61*b*, 62*b*, 63*b* are arranged so that the longitudinal direction of the rectangular shape is parallel to the predetermined direction. In addition, the plurality of elements 61*a*, 62*a*, and 63*a* are arranged so as to face the longitudinal surfaces Fa of the bus bars 61*b*, 62*b*, and 63*b*, the longitudinal surfaces Fa extending in the longitudinal direction of the rectangular shape of the cross-section.

According to the configuration, the detection accuracy of the current value can be improved, as compared with the case where the elements 61*a*, 62*a*, and 63*a* are arranged to face the short-side surfaces of the bus bars 61*b*, 62*b*, 63*b*. Nevertheless, since the sensor unit 160 has a layout in which the elements are not arranged between the adjacent bus bars 61*b*, 62*b* and 63*b*, the sensor unit 160 can be reduced in size in the depth direction ZD. In short, it is possible to reduce the size in the depth direction ZD while improving the detection accuracy.

Second Embodiment

Figure 5:
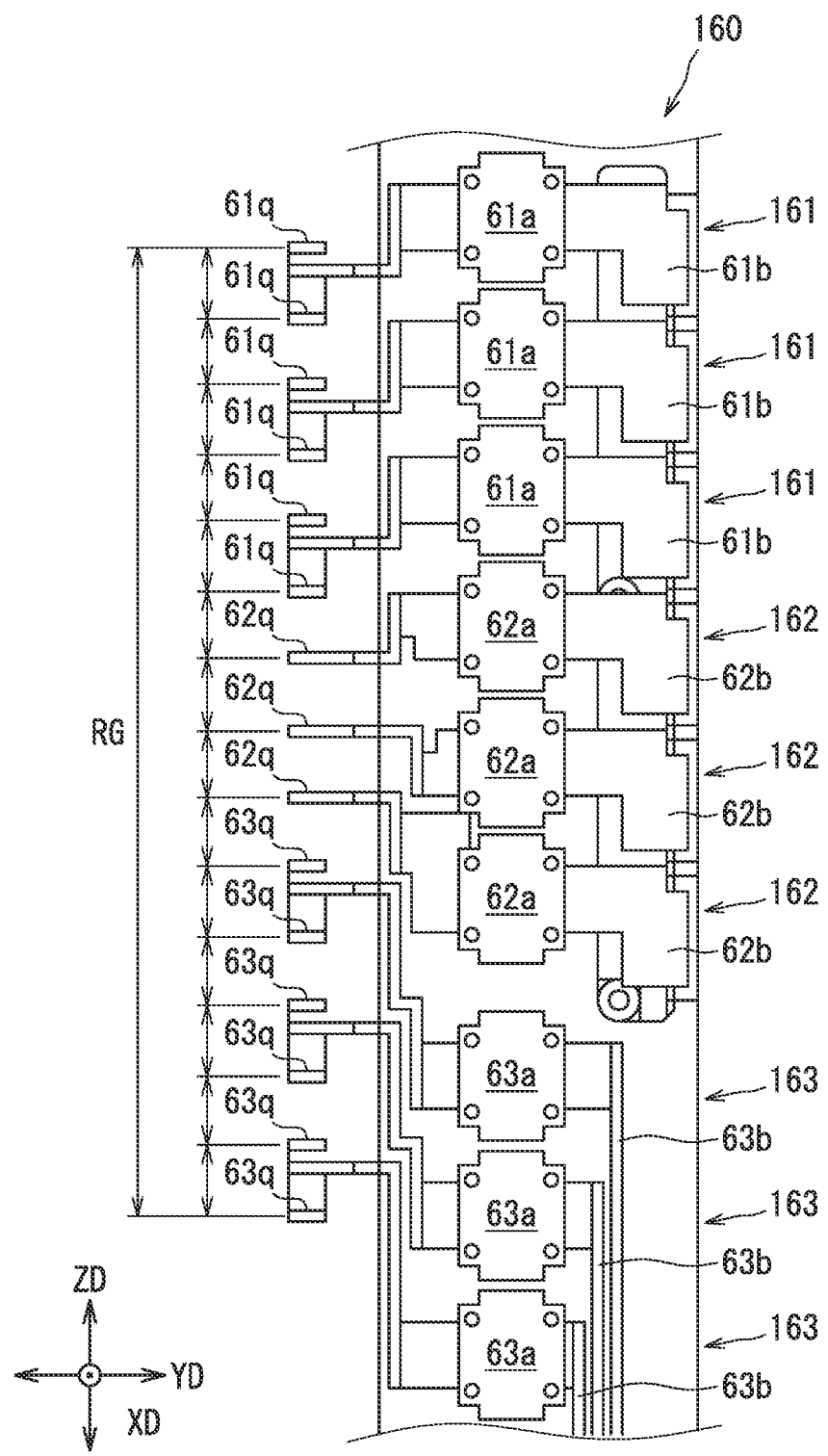
FIG. 5 is a top view of a current detection device according to a second embodiment.

In the first embodiment described above, the plurality of elements 61*a*, 62*a*, and 63*a* are arranged at equal pitches in the depth direction ZD. On the other hand, in the present embodiment, the plurality of elements 61*a*, 62*a*, and 63*a* are arranged at unequal pitches, as shown in FIG. 5.

In the first embodiment, one first module 41 is provided for each phase of the first rotary electric machine 1. On the other hand, in the present embodiment, two first modules 41 are provided for each phase of the first rotary electric machine 1. With this, two terminals 61*q* according to the present embodiment are provided for each of the first elements 61*a*. That is, two terminals 61*q* are formed by branching from one first bus bar 61*b*.

Similarly, two terminals 63*q* are formed by branching from one third bus bar 63*b*. Differently from the first embodiment having one third module 43 and one reactor 60, the sensor unit 160 of the present embodiment is provided with three third modules 43 and three reactors 60. With this, three third elements 63*a* are provided in the present embodiment. The plurality of terminals 61*q*, 62*q*, and 63*q* are arranged at equal pitches in the depth direction ZD (see the arrows in FIG. 5). This pitch coincides with the pitch of the connection point terminal 44M.

As described above, the pitches of the plurality of elements 61*a*, 62*a*, and 63*a* in the depth direction ZD do not coincide with the pitches of the connection point terminals 44M in the depth direction ZD. Nevertheless, the bus bars 61*b*, 62*b*, and 63*b* are shaped so that the pitches of the plurality of terminals 61*q*, 62*q*, and 63*q* coincide with the pitches of the connection point terminals 44M.

Other Embodiments

The disclosure in this specification, the drawings, and the like is not limited to the exemplified embodiments. The disclosure includes the illustrated embodiments and variations thereof by those skilled in the art. For example, the present disclosure is not limited to the combinations of components and/or elements shown in the embodiments. The disclosure may be implemented in various combinations. The disclosure may have additional parts that can be added to the embodiments. The disclosure encompasses omission of the components and/or the elements of the embodiments. The disclosure encompasses the replacement or combination of components and/or elements between one embodiment and another. The disclosed technical scope is not limited to the descriptions of the embodiments. Several technical scopes disclosed are indicated by descriptions in the claims and should be understood to include all modifications within the meaning and scope equivalent to the descriptions in the claims.

The disclosure in the specification, the drawings and the like is not limited by the description of the claims. The disclosure in the specification, the drawings, and the like encompasses the technical ideas described in the claims, and further extend to a wider variety of technical ideas than those in the claims. Therefore, various technical ideas can be extracted from the disclosure of the specification, the drawings and the like without being limited to the description of the claims.

In the first embodiment described above, rigid bass bars 61*b*, 62*b*, and 63*b* are used as conductors arranged to face the elements 61*a*, 62*a*, and 63*a*. On the other hand, these bus bars 61*b*, 62*b*, and 63*b* may be electric wires having flexibility.

In the first embodiment described above, the shield plates 60*d* and 60*e* are arranged so as to face each other and to interpose the elements 61*a*, 62*a* and 63*a* and the bus bars 61*b*, 62*b* and 63*b* therebetween. On the other hand, one of the pair of shield plates 60*d* and 60*e* may be eliminated. Further, the pair of shield plates 60*d* and 60*e* may be connected to each other and formed by one shield plate.

In the first embodiment described above, the elements 61*a*, 62*a*, and 63*a* are not arranged between adjacent bus bars 61*b*, 62*b*, and 63*b*. On the other hand, the elements 61*a*, 62*a*, and 63*a* may be arranged between the adjacent bus bars 61*b*, 62*b*, and 63*b*. In this case, it is desirable to arrange the bus bars 61*b*, 62*b*, and 63*b* by rotating 90 degrees from the positions shown in FIG. 4, so that the longitudinal surfaces Fa face the elements 61*a*, 62*a* and 63*a*.

The invention claimed is:

1. A current detection device for a power conversion device, the power conversion device including:
   a converter that boosts a voltage of an electric power supplied from a direct current (DC) power supply;
   a first inverter that converts a direct current boosted by the converter into an alternating current and outputs the alternating current to a first rotary electric machine; and
   a second inverter that converts the direct current boosted by the converter into an alternating current and outputs the alternating current to a second rotary electric machine,
   the current detection device comprising:

a first conductor providing a part of a current path between the first inverter and the first rotary electric machine;

a second conductor providing a part of a current path between the second inverter and the second rotary electric machine;

a third conductor providing a part of a current path between the DC power supply and the converter;

a first element arranged to face the first conductor and configured to detect a magnetic flux generated by an electric current flowing through the first conductor in a coreless manner;

a second element arranged to face the second conductor and configured to detect a magnetic flux generated by an electric current flowing through the second conductor in a coreless manner; and a third element arranged to face the third conductor and configured to detect a magnetic flux generated by an electric current flowing through the third conductor in a coreless manner, wherein a maximum value of the electric current flowing through the second conductor is smaller than a maximum value of the electric current flowing through the first conductor, and is smaller than a maximum value of the electric current flowing through the third conductor, the second conductor is arranged side by side with the first conductor and the third conductor in a predetermined direction, and the second conductor is arranged between the first conductor and the third conductor.

2. The current detection device according to claim 1, further comprising: a pair of first magnetic shields arranged to face each other and interpose the first element and the first conductor therebetween, a pair of second magnetic shields arranged to face each other and interpose the second element and the second conductor therebetween, and a pair of third magnetic shields arranged to face each other and interpose the third element and the third conductor therebetween, wherein at least one of the pair of first magnetic shields, at least one of the pair of second magnetic shields, and at least one of the pair of third magnetic shields are integral and connect to each other.

3. The current detection device according to claim 1, wherein
the first element, the second element, and the third element are arranged side by side in a straight line.

4. The current detection device according to claim 1, wherein
each of the first conductor, the second conductor, and the third conductor has a rectangular shape in cross-section defined perpendicular to a direction in which the electric current flows, and is arranged so that a longitudinal direction of the rectangular shape is parallel to the predetermined direction, and
each of the first element, the second element, and the third element is arranged so as to face a longitudinal surface of the rectangular shape, the longitudinal surface extending in the longitudinal direction.

* * * * *